(12) United States Patent
Kwon et al.

(10) Patent No.: US 9,276,050 B2
(45) Date of Patent: Mar. 1, 2016

(54) ORGANIC LIGHT EMITTING DISPLAY DEVICE

(71) Applicant: LG Display Co., Ltd., Seoul (KR)

(72) Inventors: Hoi Yong Kwon, Busan (KR); Joon Suk Lee, Seoul (KR); Eui Tae Kim, Paju-si (KR); Sung Hee Park, Goyang-si (KR); Ki Seob Shin, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/630,662

(22) Filed: Feb. 25, 2015

(65) Prior Publication Data

US 2015/0243722 A1    Aug. 27, 2015

Related U.S. Application Data

(60) Provisional application No. 61/944,501, filed on Feb. 25, 2014.

(30) Foreign Application Priority Data

Jul. 30, 2014    (KR) .................... 10-2014-0097125

(51) Int. Cl.
*H01L 27/12* (2006.01)
*H01L 27/32* (2006.01)

(52) U.S. Cl.
CPC ........ *H01L 27/3262* (2013.01); *H01L 27/1225* (2013.01); *H01L 27/1251* (2013.01); *H01L 27/3248* (2013.01); *H01L 27/3265* (2013.01); *H01L 27/3272* (2013.01); *H01L 27/3276* (2013.01)

(58) Field of Classification Search
None
See application file for complete search history.

(56) References Cited

U.S. PATENT DOCUMENTS

| 8,846,458 | B2* | 9/2014 | Lee | H01L 27/1255 438/128 |
| 8,933,868 | B2* | 1/2015 | Choi | H01L 27/3269 313/498 |
| 8,941,790 | B2* | 1/2015 | Kimura | G09G 3/3648 349/38 |
| 2007/0001938 | A1* | 1/2007 | Lee | G09G 3/3225 345/76 |
| 2007/0103608 | A1* | 5/2007 | Lee | G02F 1/13454 349/38 |
| 2011/0025637 | A1* | 2/2011 | Yi | G06F 3/0412 345/173 |
| 2011/0049523 | A1* | 3/2011 | Choi | H01L 27/1225 257/72 |
| 2015/0243719 | A1* | 8/2015 | Kwon | H01L 27/1248 257/43 |
| 2015/0243720 | A1* | 8/2015 | Kwon | H01L 27/1248 257/40 |

* cited by examiner

*Primary Examiner* — Benjamin Sandvik
(74) *Attorney, Agent, or Firm* — Fenwick & West LLP

(57) ABSTRACT

Disclosed herein is an OLED (Organic Light Emitting Display) device. A switching thin-film transistor configured to be an oxide semiconductor thin-film transistor is disposed in a first pixel. A second pixel is adjacent to the first pixel in the direction in which data lines are extended. A switching thin-film transistor configured to be an LTPS (Low Temperature Poly-Silicon) thin-film transistor is disposed in the second pixel. The switching thin-film transistor of the first pixel and the switching thin-film transistor of the second pixel are connected to the same gate line. A pixel and another pixel adjacent to the pixel connected to a gate line in common, so that it is possible to provide an OLED device with high aperture ratio and high resolution.

15 Claims, 11 Drawing Sheets

ORGANIC LIGHT EMITTING DISPLAY DEVICE

CROSS-REFERENCE TO RELATED APPLICATIONS

This application claims the priority under 35 U.S.C. §119(e) to U.S. Provisional Application No. 61/944,499 filed on Feb. 25, 2014, and under 35 U.S.C. §119(a) to Korean Patent Application No. 10-2014-0097125 filed on Jul. 30, 2014, which are incorporated by reference herein in their entirety.

BACKGROUND OF THE INVENTION

1. Field of the Invention

The present invention relates to an OLED (Organic Light Emitting Display) device. More particularly, the present invention relates to an OLED device achieving high aperture ratio and being advantageously applied to high resolution devices, in which an oxide semiconductor thin-film transistor having an active layer made of an oxide semiconductor and an LTPS (Low Temperature Poly-Silicon) thin-film transistor having an active layer made of an low temperature poly-silicon are supplied with the same gate voltage from the same gate line. Further, the present invention relates to an OLED device in which an oxide semiconductor thin-film transistor and an LTPS thin-film transistor are used as a switching thin-film transistor and a driving thin-film transistor for driving a single organic light-emitting element.

2. Description of the Related Art

As the era of information technology has begun, the field of display that visualizes the electrical information signals has been rapidly developing rapidly. In accordance with this, various flat display devices which are thinner, lighter and more efficient in power consumption have been developed fast to replace existing CRTs (Cathode Ray Tubes)

Examples of such flat display devices include an LCD (Liquid Crystal Display) device, an OLED (Organic Light Emitting Display) device, an EPD (Electrophoretic Display) device, a PDP (Plasma Display Panel) device, a FED (Field Emission Display) device, an EWD (Electro-Wetting Display) device, etc.

Among these, an OLED device emerges as the next generation display device having a self-emitting characteristic since it exhibits a good performance on LCD devices in terms of viewing angle, contrast, response time, power consumption, etc.

Commonly, flat display devices require a flat display panel as an essential element to produce images. Such a flat display panel includes a pair of substrates laminated on one another, with a layer of a luminescent material or a polarizing material between the substrates. The substrates of such a flat display panel are divided into emission regions in which arrays of pixels emit light, and element regions in which circuit elements to drive the pixels are disposed. In particular, in the element regions, a plurality of thin-film transistors (TFT) is disposed to drive the pixels and to operate the circuit elements.

An OLED device includes organic electroluminescent diodes with each consisting of an anode electrode, a film of organic compound, and a cathode electrode. Such an OLED device may be driven in a passive matrix manner in which an organic electroluminescent diode is connected between a gate line and a data line in a matrix to form a pixel, or in an active matrix manner in which the operation of a pixel is controlled by its thin-film transistor working as a switch.

In a pixel driving unit of an OLED device driven in an active matrix manner, a switching thin-film transistor of a pixel is operated by the voltage output from a circuit element via a gate line. When a data value of pixel goes through a data line to be stored in a storage capacitor, a pixel-driving current corresponding to the data value flows from a driving thin-film transistor to an organic electroluminescent diode causing the pixel to emit light as a result.

As customer's expectation for OLED devices is ever increasing, research is going on into OLED devices with high aperture ratio and high resolution. However, there are limits to reduce the sizes of thin-film transistors, capacitors and various types of supply lines required for driving OLED devices. Accordingly, efforts to implement OLED devices with high aperture ratio and high resolution are on going.

Previously in OLED devices, LTPS thin-film transistors solely or oxide semiconductor thin-film transistors solely have been used as switching thin-film transistors and driving thin-film transistors. When only one type of thin-film transistors is used, large area has been required for providing enough space for storage capacitors. To that end, space for storage capacitors needs to be large enough, so that the size of a pixel itself can be increased or the area occupied by a pixel driving unit in the pixel can become larger. This makes it difficult to manufacture a high-resolution or high-transparent panel.

SUMMARY OF THE INVENTION

An object of the present invention is to provide an OLED device in which a pixel and another pixel adjacent to the pixel have a gate line in common.

Another object of the present invention is to provide an OLED device that can be more easily driven by forming driving thin-film transistors in adjacent pixels sharing a gate line, as an oxide semiconductor thin-film transistor and as an LTPS thin-film transistor, respectively.

Yet another object of the present invention is to provide an OLED device in which, between a switching thin-film transistor and a driving thin-film transistor, one is an oxide semiconductor thin-film transistor and the other is an LTPS thin-film transistor.

Still another object of the present invention is to provide an OLED device that can achieve high resolution and high aperture ratio by forming storage capacitors as multi-layer capacitors without increasing the area occupied by the storage capacitors.

It should be noted that objects of the present invention are not limited to the above-described objects, and other objects of the present invention will be apparent to those skilled in the art from the following descriptions.

According to an aspect of the present invention, there is provided an OLED (Organic Light Emitting Display) device. A switching thin-film transistor configured to be an oxide semiconductor thin-film transistor is disposed in a first pixel. A second pixel is adjacent to the first pixel in the direction in which data lines are extended. A switching thin-film transistor configured to be an LTPS (Low Temperature Poly-Silicon) thin-film transistor is disposed in the second pixel. The switching thin-film transistor of the first pixel and the switching thin-film transistor of the second pixel are connected to the same gate line. A pixel and another pixel adjacent to the pixel connected to a gate line in common, so that it is possible to provide an OLED device with high aperture ratio and high resolution.

The gate electrode of the first switching thin-film transistor and the gate electrode of the second switching thin-film transistor may branch out from the same gate line.

The switching thin-film transistor of the first pixel and the switching thin-film transistor of the second pixel may be connected to the same data line.

The first pixel and the second pixel each may have emission regions in which organic light-emitting elements are disposed and element regions in which elements for driving the organic light-emitting elements are disposed, respectively, the switching thin-film transistor of the first pixel may be disposed in the element region of the first pixel, the switching thin-film transistor of the second pixel may be disposed in the element region of the second pixel, and the element region of the first pixel and the element region of the second pixel may be adjacent to each other.

Each of the first and second pixels further may comprise a transparent region, and the element region of the first pixel and the element region of the second pixel may be disposed between the transparent region of the first pixel and the transparent region of the second pixel.

The OLED device may further comprise a GIP (Gate In Panel) circuit portion configured to generate an electrical signal to drive the first and second pixels and the GIP circuit portion may be configured to generate AC gate voltage to sequentially drive the switching thin-film transistor of the first pixel and the switching thin-film transistor of the second pixel.

The OLED device may further comprise a light-blocking layer configured to block light directed toward active layer of the switching thin-film transistors.

The first pixel may further comprise a driving thin-film transistor connected to the switching thin thin-film transistor configured to be an oxide semiconductor thin-film transistor, a first storage capacitor having one electrode being the active layer of the driving thin-film transistor and a second storage capacitor having one electrode being the source electrode or the drain electrode of the driving thin-film transistor, the first storage capacitor and the second storage capacitor may be disposed to overlap each other, and the driving thin-film transistor may be an LTPS thin-film transistor.

Both the other electrode of the first storage capacitor and the other electrode of the second storage capacitor may be the active layer of the switching thin-film transistor.

The OLED device may further comprise a third storage capacitor overlapped with the first storage capacitor and the second storage capacitor, one electrode of the third storage capacitor may be the source electrode or the drain electrode of the driving thin-film transistor, and the other electrode of the third storage capacitor may be a metal layer electrically connected to the source electrode or the drain electrode of the switching thin-film transistor.

Both the other electrode of the first storage capacitor and the other electrode of the second storage capacitor may be the gate electrode of the driving thin-film transistor.

The other electrode of the first storage capacitor may be the gate electrode of the driving thin-film transistor and the other electrode of the second storage capacitor may be the active layer of the switching thin-film transistor.

The OLED device may further comprise a light-blocking layer configured to block light directed toward the active layers of the switching thin-film transistor and of the driving thin-film transistor and a fourth storage capacitor disposed to overlap with the first storage capacitor and the second storage capacitor, one electrode of the fourth storage capacitor may be the active layer of the driving thin-film transistor, and the other electrode thereof may be the light-blocking layer.

The second pixel may further comprise a driving thin-film transistor connected to the switching thin thin-film transistor configured to be an LTPS semiconductor thin-film transistor, a metal layer electrically connected to the source electrode or the drain electrode of the switching thin-film transistor, a first storage capacitor having one electrode being the gate electrode of the driving thin-film transistor and the other electrode being the active layer of the driving transistor and a second storage capacitor having one electrode being the source electrode or the drain electrode of the driving thin-film transistor and the other electrode being the metal layer, the first storage capacitor and the second storage capacitor may be disposed to overlap each other, and the driving thin thin-film transistor may be an oxide semiconductor thin-film transistor.

A gate insulation layer may be disposed to cover the active layer of the switching thin-film transistor, the gate electrode of the switching thin-film transistor and the gate electrode of the driving thin-film transistor may be disposed on the insulation layer, an interlayer insulation layer may be disposed to cover the gate electrode of the switching thin-film transistor and the gate electrode of the driving thin-film transistor, the active layer of the driving thin-film transistor may overlap the gate electrode thereof on the interlayer insulation layer, an etch stopper may be disposed to cover the active layer of the driving thin-film transistor, and the metal layer may be electrically connected to the source electrode or the drain electrode of the switching thin-film transistor disposed on the etch stopper and overlaps the source electrode or the drain electrode of the driving thin-film transistor.

Particulars of various exemplary embodiments of the present invention are included in the detailed description and the accompanying drawings.

According to the present invention, a pixel and another pixel adjacent to the pixel have a gate line in common, so that it is possible to provide an OLED device with high aperture ratio and high resolution.

Further, according to the present invention, an OLED device can be more easily driven by forming driving thin-film transistors, such as an oxide semiconductor thin-film transistor and an LTPS thin-film transistor respectively, in adjacent pixels sharing a gate line, In addition, according to the present invention, by forming switching thin-film transistors and driving thin-film transistors as different types of thin-film transistors, capacitance of storage capacitors can be increased and high-resolution or high-transparency panel can be manufactured more easily.

Moreover, according to the present invention, by employing a composite structure of switching thin-film transistors and driving thin-film transistors in order to drive an OLED device, it is possible to take advantages of both of oxide semiconductor transistors and LTPS thin-film transistors.

It should be noted that effects of the present invention are not limited to those described above and other effects of the present invention will be apparent to those skilled in the art from the following descriptions.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
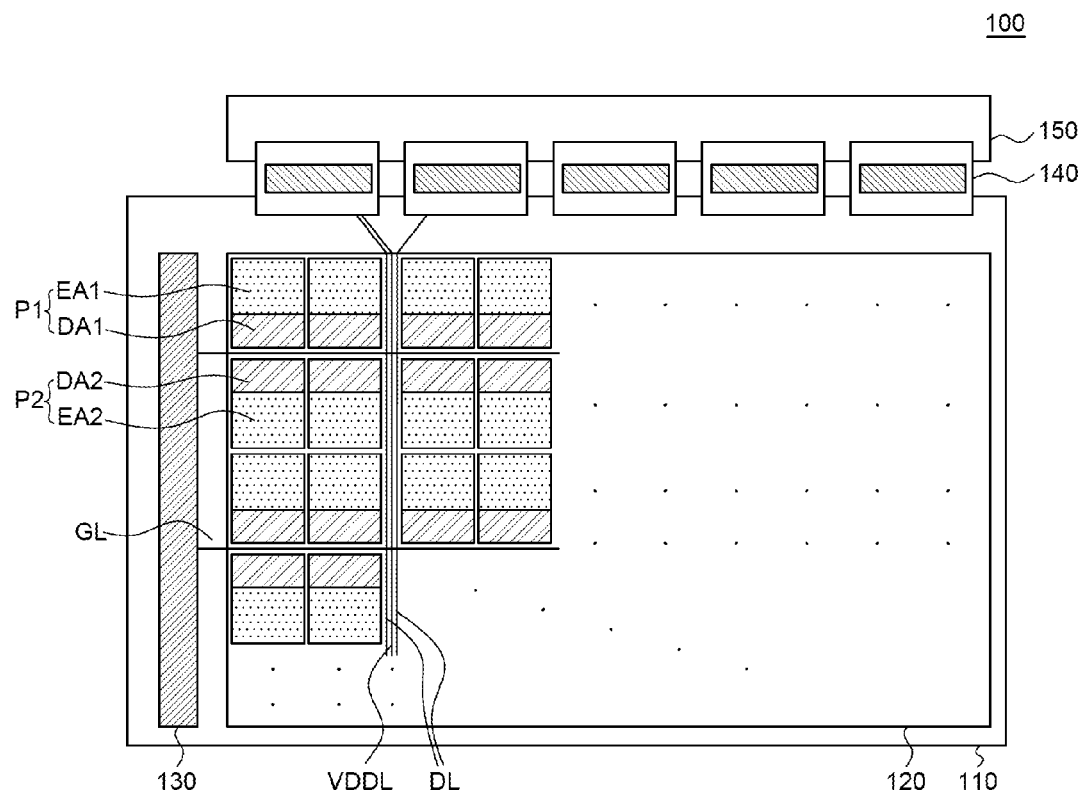
FIG. 1 is a schematic plan view for illustrating an OLED device according to an exemplary embodiment of the present invention.

Advantages and features of the present invention and methods to achieve them will become apparent from the descriptions of exemplary embodiments herein below with reference to the accompanying drawings. However, the present invention is not limited to exemplary embodiments disclosed herein but may be implemented in various different ways. The exemplary embodiments are provided for making the disclosure of the present invention thorough and for fully conveying the scope of the present invention to those skilled in the art. It is to be noted that the scope of the present invention is defined only by the claims.

The figures, dimensions, ratios, angles, numbers of elements given in the drawings are merely illustrative and are not limiting. Like reference numerals denote like elements throughout the descriptions. Further, in describing the present invention, descriptions on well-known technologies may be omitted in order not to obscure the gist of the present invention. It is to be noticed that the term "comprising," "having," including" and so on, used in the present description and claims, should not be interpreted as being restricted to the means listed thereafter unless specifically stated otherwise. Where an indefinite or definite article is used when referring to a singular noun, e.g. "a," "an," "the," this includes a plural of that noun unless specifically stated otherwise.

In describing elements, they are interpreted as including error margins even without explicit statements.

In describing positional relationship, such as "an element A on an element B," "an element A above an element B," "an element A below an element B" and "an element A next to an element B," another element C may be disposed between the elements A and B unless the term "directly" or "immediately" is explicitly used.

As used herein, a phrase "an element A on an element B" refers to that the element A may be disposed directly on the element B and/or the element A may be disposed indirectly on the element B via another element C.

The terms first, second, third and the like in the description and in the claims are used for distinguishing between similar elements and not necessarily for describing a sequential or chronological order. These terms are used to merely distinguish one element from another. Accordingly, as used herein, a first element may be a second element within the technical idea of the present invention.

Like reference numerals denote like elements throughout the descriptions.

The drawings are not to scale and the relative dimensions of various elements in the drawings are depicted schematically and not necessarily to scale.

Features of various exemplary embodiments of the present invention may be combined partially or totally. As will be clearly appreciated by those skilled in the art, technically various interactions and operations are possible. Various exemplary embodiments can be practiced individually or in combination.

Hereinafter, exemplary embodiments of the present invention will be described in detail with reference to the accompanying drawings.

Figure 2:
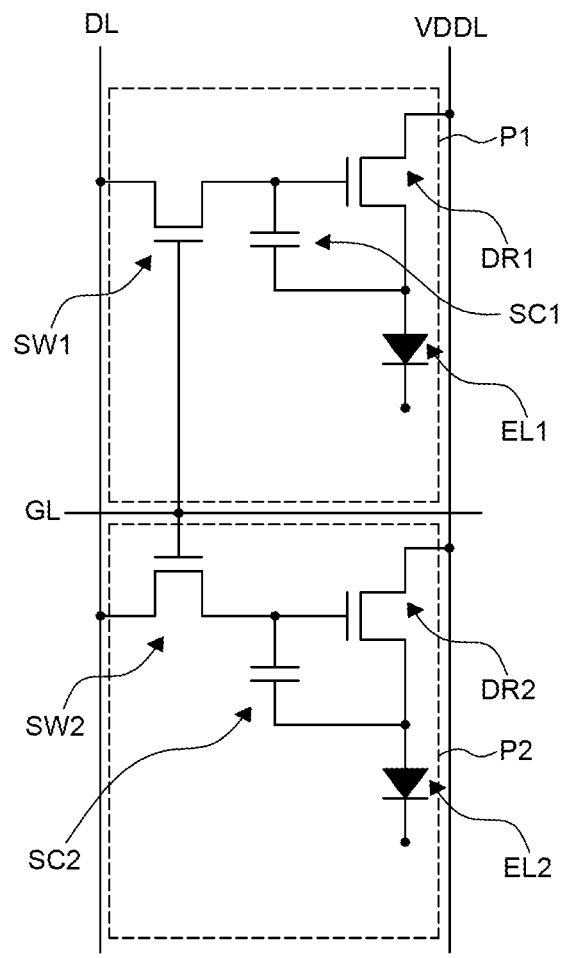
FIG. 2 is a schematic circuit diagram for illustrating a first pixel and a second pixel of an OLED device according to an exemplary embodiment of the present invention.

FIG. 1 is a schematic plan view for illustrating an OLED device according to an exemplary embodiment of the present invention. FIG. 2 is a schematic circuit diagram for illustrating first and second pixels of an OLED device according to an exemplary embodiment of the present invention. Referring to FIG. 1, an OLED device 100 includes a substrate 110, a display portion 120, a GIP (Gate In Panel) circuit portion 130, a COF (Chip On Film) 140, and a PCB (Printed Circuit Board) 150.

The substrate 110 supports thereon and protects a variety of elements of the OLED device 100. The substrate 110 may be made of an insulative material such as glass or plastic. However, the material of the substrate 110 is not limited to glass or plastic but may include various materials.

On the substrate 110 is formed the display portion 120 on which images are displayed. The display portion 120 includes organic light-emitting elements, and various thin-film transistors and capacitors for driving the organic light-emitting elements. In addition, on the display portion 120, various lines such as gate lines (GL), data lines (DL) and Vdd supply lines (VDDL) may be formed. As shown in FIG. 1, the data lines DL and the Vdd supply lines VDDL are extended in the same direction while the gate lines GL are extended in a direction different from, e.g., perpendicular to the direction in which the data lines DL and the Vdd supply lines VDDL are extended.

The substrate 110 includes a plurality of pixels, each emitting light of a specific color. The plurality of pixels may be defined as being included in the display portion 120. Each of the plurality of pixels may emit light of one of red, green and blue, or light of one of red, green, blue and white. In the following descriptions, among the plurality of pixels, a first pixel P1 and a second pixel P2 will be described.

The first pixel P1 may represent pixels disposed on an odd-numbered pixel line while the second pixel P2 may represent pixels disposed on an even-numbered pixel line. Namely, the first pixel P1 and the second pixel P2 are adjacent to each other in the vertical direction and are electrically connected to the same data line DL.

The first pixel P1 and the second pixel P2 each have emission regions EA1 and EA2 and element regions DA1 and DA2, respectively. In the emission region EA1 of the first pixel P1, a first organic light-emitting element EL1 is disposed to emit light. In the element region DA1 of the first pixel P1, various elements for driving the first organic light-emitting element EL1 are disposed, such as a first switching thin-film transistor SW1, a first storage capacitor SC1 and a first driving thin-film transistor DR1. If the OLED device 100 is of a bottom emission type, the emission region EA1 and the element region DA1 of the first pixel P1 do not overlap each other as shown in FIG. 1. However, if the OLED device 100 is of a top emission type, the emission region EA1 and the element region DA1 of the first pixel P1 may overlap each other. In the emission region EA2 of the second pixel P2, a second organic light-emitting element EL2 is disposed. In the element region DA2 of the second pixel P2, various elements for driving the second organic light-emitting element EL2 are disposed, such as a second switching thin-film transistor SW2, a second storage capacitor SC2 and a second driving thin-film transistor DR2.

The first switching thin-film transistor SW1 of the first pixel P1 is an oxide semiconductor thin-film transistor. Namely, the first switching thin-film transistor SW1 has a bottom-gate structure in which a gate electrode, an active layer made of an oxide semiconductor, a source electrode and a drain electrode, on the substrate 110, are stacked on one another in this order. The first switching thin-film transistor SW1 may be an n-type thin-film transistor. The first driving thin-film transistor DR1 of the first pixel P1 may be either an oxide semiconductor thin-film transistor or an LTPS thin-film transistor. In some embodiments, the first driving thin-film transistor DR1 and the first storage capacitor SC1 of the first pixel P1 have structures as described in FIGS. 5 to 11.

The second switching thin-film transistor SW2 of the second pixel P2 is an LTPS thin-film transistor. Namely, the second switching thin-film transistor SW2 has a coplanar structure in which an active layer made of a low temperature ploy-silicon, a gate electrode, a source electrode and a drain electrode on the substrate 110 are stacked on one another in this order. The second switching thin-film transistor SW2 may be a p-type thin-film transistor. The second driving thin-film transistor DR2 of the second pixel P2 may be either an n-type oxide semiconductor thin-film transistor or a p-type LTPS thin-film transistor. In some embodiments, the second driving thin-film transistor DR2 and the second storage capacitor SC2 of the second pixel P2 have structures as described in FIGS. 5 to 11.

The first pixel P1 and the second pixel P2 are adjacent to each other. Referring to FIG. 1, the first pixel P1 and the second pixel P2 are adjacent to each other in the direction in which the data lines DL are extended. The emission region EA1 of the first pixel P1 and the emission region EA2 of the second pixel P2 are adjacent to each other. In other words, as shown in FIG. 1, the emission region EA1 of the first pixel P1 and the emission region EA2 of the second pixel P2 face each other.

As described above, since the first switching thin-film transistor SW1 of the first pixel P1 is an n-type thin-film transistor and the second switching thin-film transistor SW2 of the second pixel P2 is a p-type thin-film transistor, the first switching thin-film transistor SW1 of the first pixel P1 and the second switching thin-film transistor SW2 of the second pixel P2 can share a single gate line GL. In other words, the first switching thin-film transistor SW1 and the second switching thin-film transistor SW2 are supplied with gate voltage from the same gate line GL. Referring to FIG. 2, the gate electrode of the first switching thin-film transistor SW1 and the gate electrode of the second switching thin-film transistor SW2 branch out from the same gate line GL. Accordingly, in the OLED device 100 according to the exemplary embodiment of the present invention, the number of the gate lines GL can be reduced by half and the area occupied by the gate lines GL can also be reduced accordingly. Consequently, the number of pixels or the area occupied by the pixels included in the OLED device 100 can be increased, so that an OLED device with high aperture ratio and high resolution can be implemented. The driving of the first pixel P1 and the second pixel P2 will be described below with reference to FIG. 3.

Referring back to FIG. 1, on the substrate 110, the GIP circuit portion 130 is disposed on one side of the display portion 120. In the GIP circuit portion 130, various circuits, such as thin-film transistors and capacitors, for applying gate voltage to the plurality of pixels on the display portion 120 are formed. The GIP circuit portion 130 is configured to generate AC gate voltage for sequentially turning on the first switching thin-film transistor SW1 of the first pixel P1 and the second switching thin-film transistor SW2 of the second pixel P2. The gate lines GL are extended from the GIP circuit portion 130. The COF 140 is disposed on which a data driver IC or the like is formed. The COF 140 is connected to a separate PCB 150. The data lines DL and the Vdd supply lines VDDL may be electrically connected to the COF 140. Although the GIP circuit portion 130 is formed on one side of the display portion 120 in FIG. 1, the GIP circuit portion 130 may be formed on either side of the display portion 120.

As described above, in the OLED device 100 according to the exemplary embodiment of the present invention, as the number of the gate lines GL is reduced, routing associated with the gate lines GL can be simpler, and accordingly the size and the numbers of the GIP circuit portion(s) 130 and other lines can be reduced. As a result, according to the exemplary embodiment of the present invention, the width of the bezel of the OLED device 100 can be further reduced.

In some exemplary embodiments, a light-blocking layer may be formed that is configured to block light directed toward the active layers of the second switching thin-film transistor SW2 of the second pixel P2 and of the first switching thin-film transistor SW1 of the first pixel P1. The light-blocking layer may be formed between the substrate 110 and the switching thin-film transistors SW1 and SW2.

Figure 3:
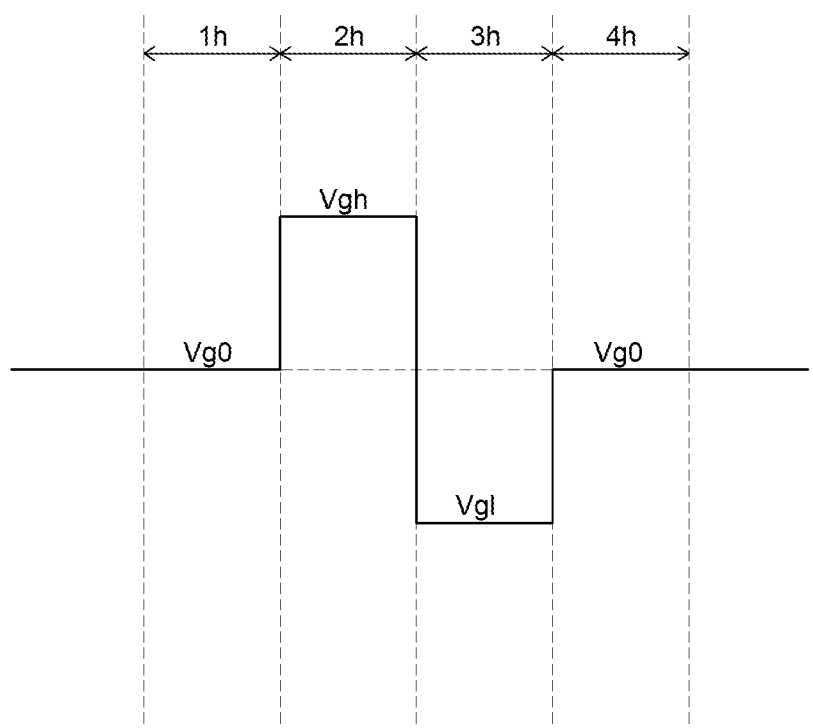
FIG. 3 is a schematic timing diagram for illustrating gate voltage applied to a gate line shared by a first pixel and a second pixel of an OLED device according to an exemplary embodiment of the present invention.

FIG. 3 is a schematic timing diagram for illustrating gate voltage applied to a gate line shared by a first pixel and a second pixel of an OLED device according to an exemplary embodiment of the present invention. FIG. 3 shows changes in AC gate voltage over time, applied by the GIP circuit portion 130 via a gate line GL shared by a first pixel P1 and a second pixel P2.

The OLED device 100 according to an exemplary embodiment of the present invention allows the first switching thin-film transistor SW1 of the first pixel P1 and the second switching thin-film transistor SW2 of the second pixel P2 to be driven via a single gate line GL, based on the difference between an n-type thin-film transistor and a p-type thin-film transistor. Specifically, if a gate voltage at high level is applied to the gate line GL, the first switching thin-film transistor SW1 is turned on to drive the first driving thin-film transistor DR1 of the first pixel P1. If a gate voltage at low level is applied to the gate line GL, the second switching thin-film transistor SW2 is turned on to drive the second driving thin-film transistor DR2 of the second pixel P2.

The driving thin-film transistors are turned on by data voltage. Current flowing in organic light-emitting elements is also adjusted by the data voltage. The data voltage is applied to the gate electrodes of the driving thin-film transistors timely by means of the switching thin-film transistors. In the OLED device 100 according to an exemplary embodiment of the present invention, a first pixel P1 and a second pixel P2 are driven by adjusting the level and timing of the gate voltage applied to the first switching thin-film transistor SW1 of the first pixel P1 and the second switching thin-film transistor SW2 of the second pixel P2.

Referring to FIG. 3, during the time periods $1h$ and $4h$ in which voltage Vg0 is applied, neither the first switching thin-film transistor SW1 of the first pixel P1 nor the second switching thin-film transistor SW2 of the second pixel P2 is operated.

During the time period $2h$, voltage Vgh at high level is applied to the gate line GL. At this time period, the voltage Vgh is delivered to both the first switching thin-film transistor SW1 of the first pixel P1 and the second switching thin-film transistor SW2 of the second pixel P2. However, only the first switching thin-film transistor SW1 is turned on while the second switching thin-film transistor SW2 is not operated, since the first switching thin-film transistor SW1 is an n-type oxide semiconductor thin-film transistor while the second switching thin-film transistor SW1 is a p-type oxide semiconductor thin-film transistor.

During the time period 3h, voltage Vg1 at low level is applied to the gate line GL. At this time period, the voltage Vg1 is delivered to both the first switching thin-film transistor SW1 of the first pixel P1 and the second switching thin-film transistor SW2 of the second pixel P2. However, only the second switching thin-film transistor SW2 is turned on while the first switching thin-film transistor SW1 is not operated, since the first switching thin-film transistor SW1 is an n-type oxide semiconductor thin-film transistor while the second switching thin-film transistor SW1 is a p-type oxide semiconductor thin-film transistor.

Levels of the gate voltage shown in FIG. 3 and threshold voltages of the thin-film transistors for proper operation are indicated below. These values, however, are merely illustrative and are not limiting.

0 V<data voltage<5 V
Vg1=−10 V
Vg0=3 V
Vgh=15 V
Vref=1 V (the initial voltage applied to the gate electrodes of the driving thin-film transistors DR1 and DR2)
Vth_n=3 V (the threshold voltage of the first switching thin-film transistor SW1)
Vth_p=−2.5V (the threshold voltage of the second switching thin-film transistor SW2)

Figure 4:
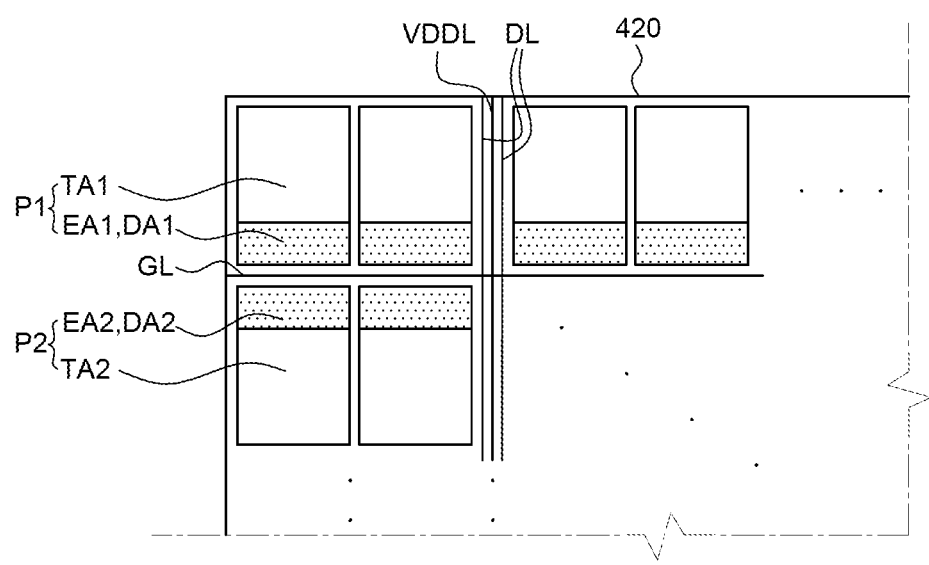
FIG. 4 is a schematic plan view for illustrating another OLED device according to another exemplary embodiment of the present invention.

FIG. 4 is a schematic plan view for illustrating an OLED device according to another exemplary embodiment of the present invention. The OLED device 400 shown in FIG. 4 is a transparent OLED device. FIG. 4 shows only a display portion 420 of the OLED device 400 for the sake of convenience. The OLED device 400 of FIG. 4 is substantially identical to the OLED device 100 of FIGS. 1 and 2 except that a first pixel P1 and a second pixel P2 further include transparent regions TA1 and TA2, respectively; and, therefore, redundant descriptions will not be made.

Referring to FIG. 4, the first pixel P1 and the second pixel P2 have emission regions EA1 and EA2 and transparent regions TA1 and TA2, respectively. As shown in FIG. 4, if the OLED device 400 is a transparent OLED device, the emission region EA1 of the first pixel P1 and an element region DA1 of the first pixel P1 may be overlapped each other, and the emission region EA2 of the second pixel P2 and an element region DA2 of the second pixel P2 may be overlapped each other. However, without limitation, the emission region EA1 of the first pixel P1 and the element region DA1 of the first pixel P1 may not overlap each other, and the emission region EA2 of the second pixel P2 and the element region DA2 of the second pixel P2 may not overlap each other.

The emission region EA1 of the first pixel P1 and the emission region EA2 of the second pixel P2 are adjacent to each other. Namely, the element region DA1 of the first pixel P1 and the element region DA2 of the second pixel P2 are adjacent to each other. Accordingly, the emission region EA1 of the first pixel P1 and the emission region EA2 of the second pixel P2 are disposed between the transparent region TA1 of the first pixel P1 and the transparent region TA2 of the second pixel P2.

It is an upcoming issue for implementing a transparent OLED device 400 to prepare the space for the transparent regions TA1 and TA2. As described above, in the OLED device 400 according to this exemplary embodiment, since the first switching thin-film transistor SW1 of the first pixel P1 is an n-type thin-film transistor and the second switching thin-film transistor SW2 of the second pixel P2 is a p-type thin-film transistor, the first switching thin-film transistor SW1 of the first pixel P1 and the second switching thin-film transistor SW2 of the second pixel P2 can share a single gate line GL. In other words, the first switching thin-film transistor SW1 and the second switching thin-film transistor SW2 are supplied with gate voltage from the same gate line GL. Accordingly, in the OLED device 400 according to this exemplary embodiment of the present invention, the number of the gate lines GL can be reduced by half and the area occupied by the gate lines GL can also be reduced accordingly. Likewise, the area occupied by the transparent regions TA1 and TA2 included in the OLED device 400 can be increased and the aperture ratio of the transparent OLED device 400 can be improved.

Figure 5:
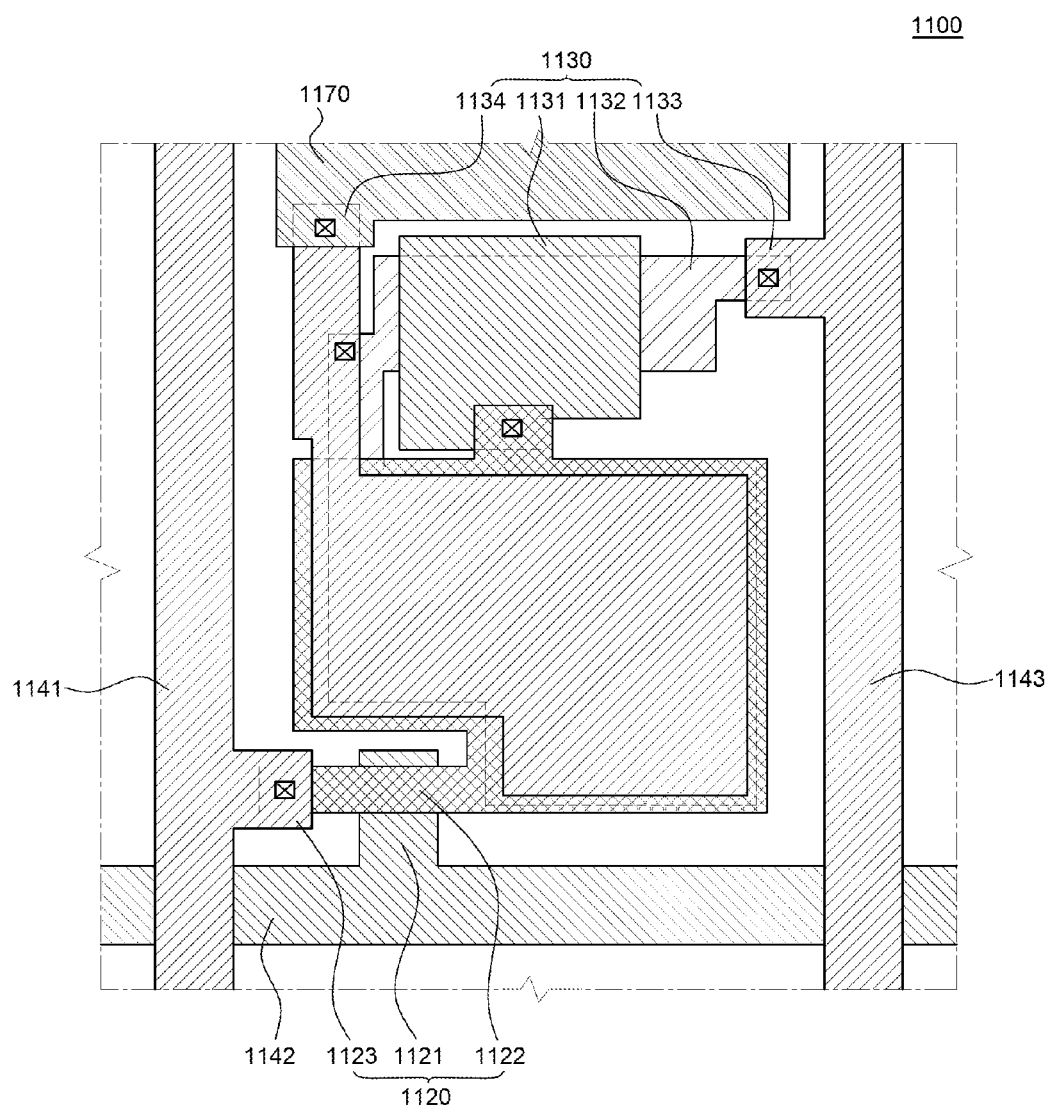
FIG. 5 is a schematic plan view for illustrating an OLED device according to an exemplary embodiment of the present invention.
Figure 6:
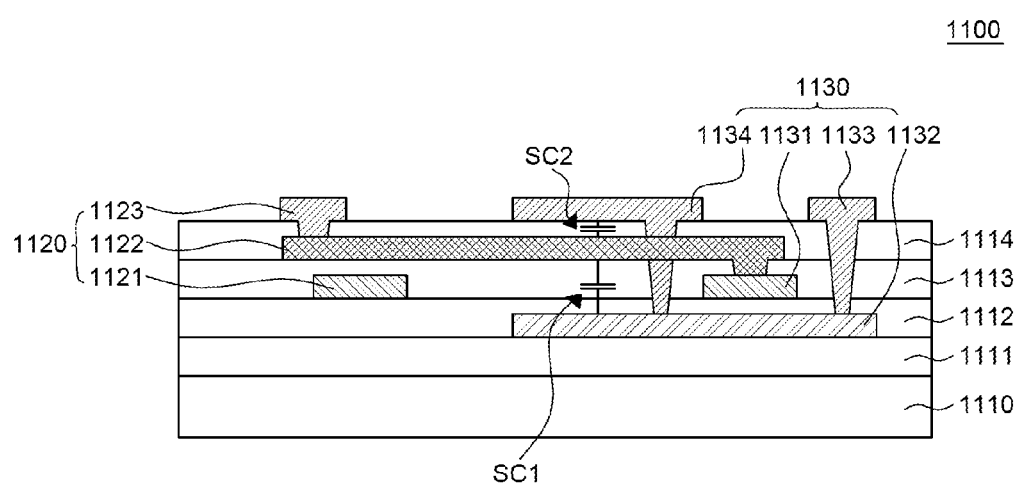
FIG. 6 is a schematic cross-sectional view for illustrating an OLED device according to an exemplary embodiment of the present invention.

FIG. 5 is a schematic plan view for illustrating an OLED device according to an exemplary embodiment of the present invention. FIG. 6 is a schematic cross-sectional view for illustrating an OLED device according to an exemplary embodiment of the present invention. Referring to FIGS. 5 and 6, an OLED device 1100 includes a substrate 1110, a switching thin-film transistor 1220, a driving thin-film transistor 1130, a first storage capacitor SC1 and a second storage capacitor SC2.

The substrate 1110 supports thereon and protects a variety of elements of the OLED device 1100. The substrate 1110 may be made of an insulative material such as glass or plastic. However, the material of the substrate 110 is not limited to glass or plastic but may include various materials.

A buffer layer 1110 may be formed on the substrate 1111. The buffer layer 1111 prevents moisture or oxygen from permeating through the substrate 1110 and makes a surface of the substrate 1110 flat. The buffer layer 1111 may be made of an insulative material. The insulative material of the buffer layer 1111 may be selected depending on the type of the substrate 1110, the type of the switching thin-film transistor 1120 or the driving thin-film transistor 1130. However, the buffer layer 1111 may be eliminated.

On the buffer layer 1111, the switching thin-film transistor 1120 and the driving thin-film transistor 1130 are formed. The switching thin-film transistor 1120 includes a gate electrode 1121, an active layer 1122, a source electrode and a drain electrode 1123. Further, the driving thin-film transistor 1130 includes a gate electrode 1131, an active layer 1132, a source electrode 1134 and a drain electrode 1133. In FIGS. 5 and 6, the source electrode of the switching thin-film transistor 1120 is not shown. Instead, the active layer 1122 of the switching thin-film transistor 1120 is directly in contact with the gate electrode 1131 of the driving thin-film transistor 1130. If the source electrode of the switching thin-film transistor 1120 is used, the source electrode of the switching thin-film transistor 1120 is formed on the same layer and is made of the same material as that of the drain electrode 1123 of the switching thin-film transistor 1120, and the source electrode of the switching thin-film transistor 1120 may be in contact with the gate electrode 1131 of the driving thin-film transistor 1130 at a certain position.

Referring to FIG. 6, the driving thin-film transistor 1130 is a coplanar thin-film transistor. Specifically, the driving thin-film transistor 1130 has a structure in which the active layer 1132, the gate electrode 1131, the source electrode 1134 and the drain electrode 1133 on the substrate 1110 are stacked on one another in this order. The switching thin-film transistor 1120 is a bottom-gate thin-film transistor. Specifically, the switching thin-film transistor 1120 has a structure in which the gate electrode 1121, the active layer 1122, the source electrode and the drain electrode 1123 on the substrate 1110 are stacked on one another in this order.

Referring to FIGS. 5 and 6, the active layer 1132 of the driving thin-film transistor 1120 is formed on the buffer layer 1111. The active layer 1132 of the driving thin-film transistor 1130 is made of a low temperature poly silicon. Namely, the driving thin-film transistor 1130 is an LTPS thin-film transistor.

On the active layer 1132 of the driving thin-film transistor 1130 is formed a gate insulation layer 1112. The gate insulation layer 1112 covers the active layer 1132 of the driving thin-film transistor 1130. The gate insulation layer 1112 is made of an insulative material so as to insulate the active layer 1132 from the gate electrode 1131 of the driving thin-film transistor 1130.

On the gate insulation layer 1112 are formed the gate electrode 1121 of the switching thin-film transistor 1120 and the gate electrode 1131 of the driving thin-film transistor 1130. The gate electrode 1121 of the switching thin-film transistor 1120 branches out from the gate line 1142 and receives a gate signal from the gate line 1142. The gate electrode 1131 of the driving thin-film transistor 1130 overlaps the active layer 1132 of the driving thin-film transistor 1130. The gate electrode 1121 of the switching thin-film transistor 1120 may be made of the same material as that of the gate electrode 1121 of the driving thin-film transistor 1130.

An interlayer insulation layer 1113 is formed over the gate insulation layer 1121 of the switching thin-film transistor 1120 and the gate electrode 1131 of the driving thin-film transistor 1130. The interlayer insulation layer 1113 covers the gate electrode 1121 of the switching thin-film transistor 1120 and the gate electrode 1131 of the driving thin-film transistor 1130. The interlayer insulation layer 1113 is made of an insulative material so as to insulate the active layer 1122 from the gate electrode 1121 of the switching thin-film transistor 1120.

On the interlayer of insulation layer 1113 is formed the active layer 1122 of the switching thin-film transistor 1120. The active layer 1122 of the switching thin-film transistor 1120 is made of an oxide semiconductor. Namely, the switching thin-film transistor 1120 is an oxide semiconductor thin-film transistor. The oxide semiconductor used as the material of the active layer 1122 may include: quaternary metal oxide such as indium-tin-gallium-zinc-oxide (InSnGaZnO) based material; ternary metal oxide such as indium-gallium-zinc-oxide (InGaZnO) based material, indium-tin-zinc-oxide (InSnZnO) based material, indium-aluminum-zinc-oxide (InAlZnO) based material, indium-hafnium-zinc-oxide (InHfZnO), tin-gallium-zinc-oxide (SnGaZnO) based material, aluminum-gallium-zinc-oxide (AlGaZnO) based material, and tin-aluminum-zinc-oxide based (SnAlZnO) material; binary metal oxide such as indium-zinc-oxide (InZnO) based material, tin-zinc-oxide (SnZnO) based material, aluminum-zinc-oxide (AlZnO) based material, zinc-magnesium-oxide (ZnMgO) based material, tin-magnesium-oxide (SnMgO) based material, indium-magnesium-oxide (InMgO) based material, and indium-gallium-oxide (InGaO) based material; and mono metal oxide such as indium-oxide (InO) based material, tin-oxide (SnO) material, and zinc-oxide (ZnO) based material. The composition ratios among elements contained in the oxide semiconductor materials listed above are not limited to specific values but may be variously selected.

The active layer 1122 of the switching thin-film transistor 1120 overlaps the gate electrode 1121 of the switching thin-film transistor 1120. In FIGS. 5 and 6, the source electrode of the switching thin-film transistor 1120 is not shown, and the active layer 1122 of the switching thin-film transistor 1120 may be electrically connected to the gate electrode 1131 of the driving thin-film transistor 1130. For example, as shown in FIG. 6, the active layer 1122 of the switching thin-film transistor 1120 may be in contact with the gate electrode 1131 of the driving thin-film transistor 1130 via a contact hole formed in the interlayer insulation layer 1113.

An etch stopper 1114 is formed over the active layer 1122 of the switching thin-film transistor 1120. The etch stopper 1114 covers the active layer 1122 of the switching thin-film transistor 1120. The etch stopper 1114 is made of an insulative material to insulate the active layer 1122 of the switching thin-film transistor 1120 from the drain electrode 1123 of the switching thin-film transistor 1120, the source electrode 1134 and drain electrode 1133 of the driving thin-film transistor 1130.

On the etch stopper 1114 is formed the drain electrode 1123 of the switching thin-film transistor 1120. The drain electrode 1123 of the switching thin-film transistor 1120 branches out from the data line 1141 and receives a data signal from the data line 1141. The drain electrode 1123 of the switching thin-film transistor 1120 is electrically connected to the active layer 1122 of the switching thin-film transistor 1120 via a contact hole formed in the etch stopper 1114. Although not shown in FIGS. 5 and 6, if the source electrode of the switching thin-film transistor 1120 is used, the drain electrode 1123 of the switching thin-film transistor 1120 is formed on the same layer and is made of the same material as the source electrode of the switching thin-film transistor 1120, and then the source electrode of the switching thin-film transistor 1120 may be in contact with the gate electrode 1131 of the driving thin-film transistor 1130 at a certain position.

On the etch stopper 1114 are formed the source electrode 1134 and the drain electrode 1133 of the driving thin-film transistor 1130. The source electrode 1134 of the driving thin-film transistor 1130 is electrically connected to the active layer 1132 of the driving thin-film transistor 1130 via a contact hole formed through the gate insulation layer 1112, the interlayer insulation layer 1113 and the etch stopper 1114. The source electrode 1134 of the driving thin-film transistor 1130 overlaps the active layer 1122 of the switching thin-film transistor 1120. The drain electrode 1133 of the driving thin-film transistor 1130 is electrically connected to the active layer 1132 of the driving thin-film transistor 1130 via a contact hole formed through the gate insulation layer 1112, the interlayer insulation layer 1113 and the etch stopper 1114. The drain electrode 1133 of the driving thin-film transistor 1130 branches out from the Vdd supply line 1143 and receives voltage Vdd from the Vdd supply line 1143. A planarization layer may be formed on the source electrode 1134 of the driving thin-film transistor 1130. The source electrode 1134 of the driving thin-film transistor 1130 may be electrically connected to an anode 1170 via a contact hole formed in the planarization layer. The source electrode 1134 and the drain electrode 1133 of the driving thin-film transistor 1130 may be made of the same material as the drain electrode 1123 of the switching thin-film transistor 1120.

A first storage capacitor SC1 and a second storage capacitor SC2 are formed on the substrate 1110. The first storage capacitor SC1 and the second storage capacitor SC2 work as one storage capacitor. One electrode of the first storage capacitor SC1 is the active layer 1132 of the driving thin-film transistor 1130 and the other electrode of the first storage capacitor SC1 is the active layer 1122 of the switching thin-film transistor 1120 which is superposed above the active layer 1132 of the driving thin-film transistor 1130. One electrode of the second storage capacitor SC2 is the source electrode 1134 of the driving thin-film transistor 1130 and the other electrode of the second storage capacitor SC2 is the active layer 1122 of the switching thin-film transistor 1120 which the source electrode 1134 of the driving thin-film transistor 1130 overlaps.

In the OLED device 1100 according to an exemplary embodiment of the present invention, by employing a composite thin-film transistor in which the switching thin-film transistor 1120 is an oxide semiconductor thin-film transistor and the driving thin-film transistor 1130 is an LTPS thin-film transistor, it is possible to implement a storage capacitor having a double-layer capacitor structure. In other words, the active layer 1132 of the driving thin-film transistor 1130 and the active layer 1122 of the switching thin-film transistor 1120 form a first storage capacitor SC1, and the source electrode 1134 of the driving thin-film transistor 1130 and the active layer 1122 of the switching thin-film transistor 1120 form a second storage capacitor SC2, so that capacitance of the storage capacitor can be increased in a given area. By means of the double-layer capacitor structure, the OLED device 1100 with high resolution and high transparency can be implemented.

Additionally, in the OLED device 1100 according to an exemplary embodiment of the present invention, an oxide semiconductor thin-film transistor with low off-current is used as the switching thin-film transistor 1120, thereby saving power consumption. Further, an LTPS thin-film transistor with good electron mobility is used as the driving thin-film transistor 1130, thereby reducing the size of the driving thin-film transistor 1130. Consequently, the OLED device 1100 with high resolution and high transparency can be implemented advantageously. In addition, the driving thin-film transistor 1130 can be operated stably for a long usage time, and reliability of the OLED device 1100 is improved.

Although the drain electrode 1123 of the switching thin-film transistor 1120 branches out from the data line 1141 in FIGS. 5 and 6, the source electrode of the switching thin-film transistor 1120 may branch out from the data line 1141 and the drain electrode 1123 of the switching thin-film transistor 1120 may not be used. In addition, in FIGS. 5 and 6, the drain electrode 1133 of the driving thin-film transistor 1130 braches out from the Vdd supply line 1143, and the source electrode 1134 of the driving thin-film transistor 1130 overlaps the active layer 1122 of the switching thin-film transistor 1120 so as to work as one electrode of the second storage capacitor SC2. However, the source electrode 1134 of the driving thin-film transistor 1130 may branch out from the Vdd supply line 1143, and the drain electrode 1133 of the driving thin-film transistor 1130 may overlap the active layer 1122 of the switching thin-film transistor 1120 to work as one electrode of the second storage capacitor SC2.

Figure 7:
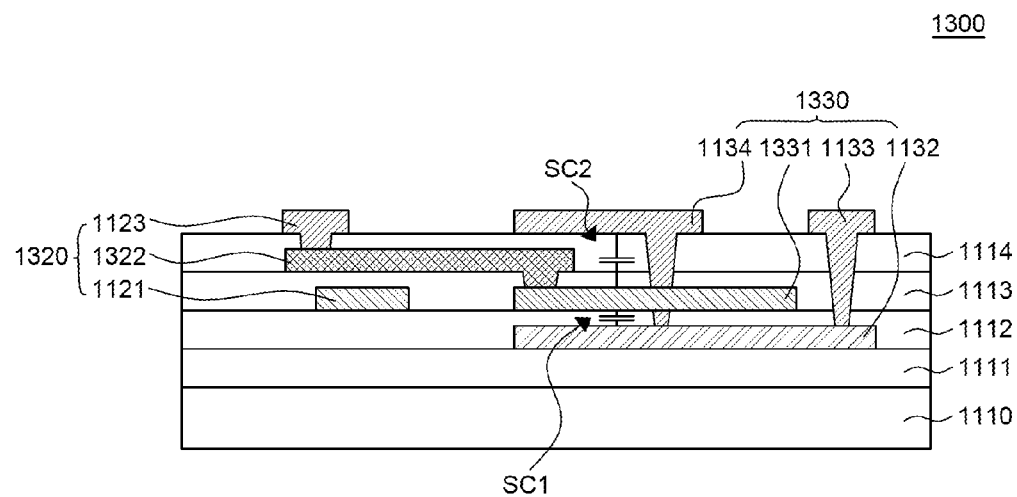
FIGS. 7 to 11 are schematic cross-sectional plan views for illustrating OLED devices according to various exemplary embodiments of the present invention.

FIG. 7 is a schematic cross-sectional plan view for illustrating an OLED device according to another exemplary embodiment of the present invention. The OLED device 1300 shown in FIG. 7 is substantially identical to the OLED device 1100 shown in FIG. 6 except for differences in the disposal of an active layer 1322 of a switching thin-film transistor 1320, a gate electrode 1331 of a driving thin-film transistor 1330, a first storage capacitor SC1 and a second storage capacitor SC2; and, therefore, descriptions on the like elements will not be made again.

Referring to FIG. 7, a gate insulation layer 1112 is formed to cover the active layer 1132 of the driving thin-film transistor 1330. On the gate insulation layer 1112, the gate electrode 1121 of the switching thin-film transistor 1320 and the gate electrode 1331 of the driving thin-film transistor 1330 are formed. In this regard, the active layer 1132 of the driving thin-film transistor 1330 overlaps the gate electrode 1331 of the driving thin-film transistor 1330 not only at a position between the source electrode 1134 and the drain electrode 1133 of the driving thin-film transistor 1330, where a channel is created when the driving thin-film transistor 1330 is turned on, but also at a position where no channel is formed. An interlayer insulation layer 1113 is formed to cover the gate electrode 1121 of the switching thin-film transistor 1320 and the gate electrode 1331 of the driving thin-film transistor 1330. On the interlayer insulation layer 1113 is formed the active layer 1322 of the switching thin-film transistor 1320. An etch stopper 1114 is formed to cover the active layer 1322 of the switching thin-film transistor 1320. The source electrode 1134 of the driving thin-film transistor 1330 is formed on the etch stopper 1114 so that it overlaps the gate electrode 1331 of the driving thin-film transistor 1330.

Accordingly, one electrode of the first storage capacitor SC1 is the active layer 1332 of the driving thin-film transistor 1130, and the other electrode of the first storage capacitor SC1 is the gate electrode 1331 of the driving thin-film transistor 1330 which overlaps the active layer 1132 of the driving thin-film transistor 1330. In addition, one electrode of the second storage capacitor SC2 is the source electrode 1334 of the driving thin-film transistor 1130, and the other electrode of the second storage capacitor SC2 is the gate electrode 1331 of the driving thin-film transistor 1330 which the source electrode 1134 of the driving thin-film transistor 1330 overlaps.

In the OLED device 1300 according to this exemplary embodiment of the present invention, by employing a composite thin-film transistor in which the switching thin-film transistor 1320 is an oxide semiconductor thin-film transistor and the driving thin-film transistor 1330 is an LTPS thin-film transistor, it is possible to implement a storage capacitor having a double-layer capacitor structure. In other words, the active layer 1332 of the driving thin-film transistor 1330 and the gate electrode 1331 of the driving thin-film transistor 1330 form a first storage capacitor SC1, and the source electrode 1334 of the driving thin-film transistor 1130 and the gate electrode 1331 of the driving thin-film transistor 1330 form a second storage capacitor SC2, so that capacitance of the storage capacitor can be increased in a given area. By means of the double-layer capacitor structure, the OLED device 1300 with high resolution and high transparency can be implemented.

The drain electrode 1133 of the switching thin-film transistor 1320 shown in FIG. 7 may be replaced with the source electrode. The source electrode 1134 and the drain electrode 1133 of the driving thin-film transistor 1330 shown in FIG. 7 are interchangeable.

Figure 8:
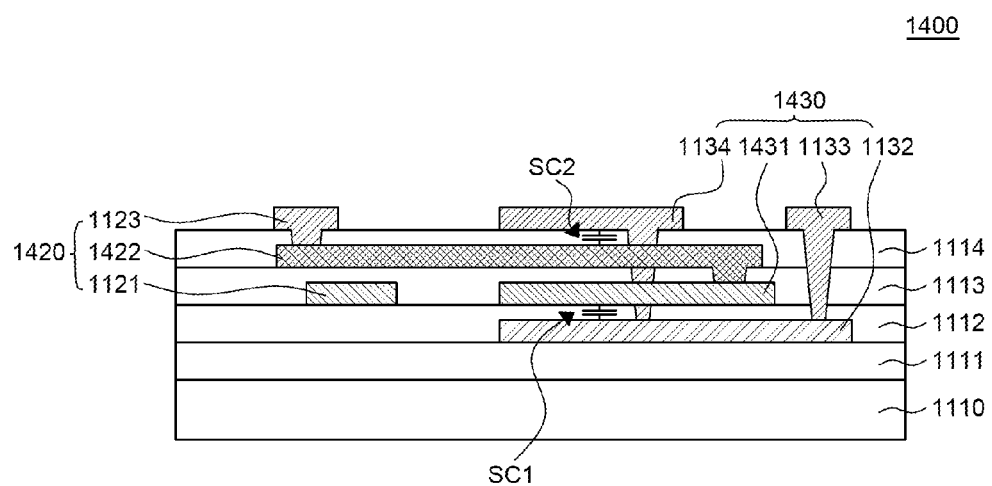

FIG. 8 is a schematic cross-sectional plan view for illustrating an OLED device according to yet another exemplary embodiment of the present invention. The OLED device 1400 shown in FIG. 8 is substantially identical to the OLED device 1100 shown in FIG. 6 except for differences in the disposal of an active layer 1422 of a switching thin-film transistor 1420, a gate electrode 1431 of a driving thin-film transistor 1430, a first storage capacitor SC1 and a second storage capacitor SC2; and, therefore, descriptions on the like elements will not be made again.

Referring to FIG. 8, a gate insulation layer 1112 is formed to cover the active layer 1132 of the driving thin-film transistor 1430. On the gate insulation layer 1112, the gate electrode 1121 of the switching thin-film transistor 1420 and the gate electrode 1431 of the driving thin-film transistor 1430 are formed. In this regard, the active layer 1422 of the driving thin-film transistor 1430 overlaps the gate electrode 1431 of the driving thin-film transistor 1430 not only at a position between the source electrode 1134 and the drain electrode 1133 of the driving thin-film transistor 1430, where a channel is created when the driving thin-film transistor 1430 is turned on, but also at a position where no channel is formed. An interlayer insulation layer 1113 is formed to cover the gate electrode 1121 of the switching thin-film transistor 1420 and the gate electrode 1431 of the driving thin-film transistor 1430. On the interlayer insulation layer 1113 is formed the active layer 1422 of the switching thin-film transistor 1420. The active layer 1422 of the switching thin-film transistor 1420 is electrically connected to the gate electrode 1431 of the driving thin-film transistor 1430. An etch stopper 1114 is formed to cover the active layer 1422 of the switching thin-film transistor 1420. The source electrode 1134 of the driving thin-film transistor 1430 is formed on the etch stopper 1114 so that it overlaps the active layer 1422 of the switching thin-film transistor 1420.

Accordingly, one electrode of the first storage capacitor SC1 is the active layer 1132 of the driving thin-film transistor 1430, and the other electrode of the first storage capacitor SC1 is the gate electrode 1431 of the driving thin-film transistor 1430 which overlaps the active layer 1132 of the driving thin-film transistor 1430. In addition, one electrode of the second storage capacitor SC2 is the source electrode 1134 of the driving thin-film transistor 1430, and the other electrode of the second storage capacitor SC2 is the active layer 1422 of the switching thin-film transistor 1420 which overlaps the source electrode 1134 of the driving thin-film transistor 1430.

In the OLED device 1400 according to this exemplary embodiment of the present invention, by employing a composite thin-film transistor in which the switching thin-film transistor 1420 is an oxide semiconductor thin-film transistor and the driving thin-film transistor 1430 is an LTPS thin-film transistor, it is possible to implement a storage capacitor having a double-layer capacitor structure. In other words, the active layer 1132 of the driving thin-film transistor 1430 and the gate electrode 1431 of the driving thin-film transistor 1430 form a first storage capacitor SC1, and the source electrode 1134 of the driving thin-film transistor 1430 and the active layer 1422 of the switching thin-film transistor 1420 form a second storage capacitor SC2, so that capacitance of the storage capacitor can be increased in a given area. By means of the double-layer capacitor structure, the OLED device 1400 with high resolution and high transparency can be implemented.

Additionally, in the OLED device 1400 according to this another exemplary embodiment of the present invention, by narrowing the distance between the electrodes of the first storage capacitor SC1 and the distance between the electrodes of the second storage capacitor SC2, the area occupied by the storage capacitor can be further reduced.

The drain electrode 1123 of the switching thin-film transistor 1420 shown in FIG. 8 may be replaced with the source electrode. The source electrode 1134 and the drain electrode 1133 of the driving thin-film transistor 1430 shown in FIG. 8 are interchangeable.

Figure 9:
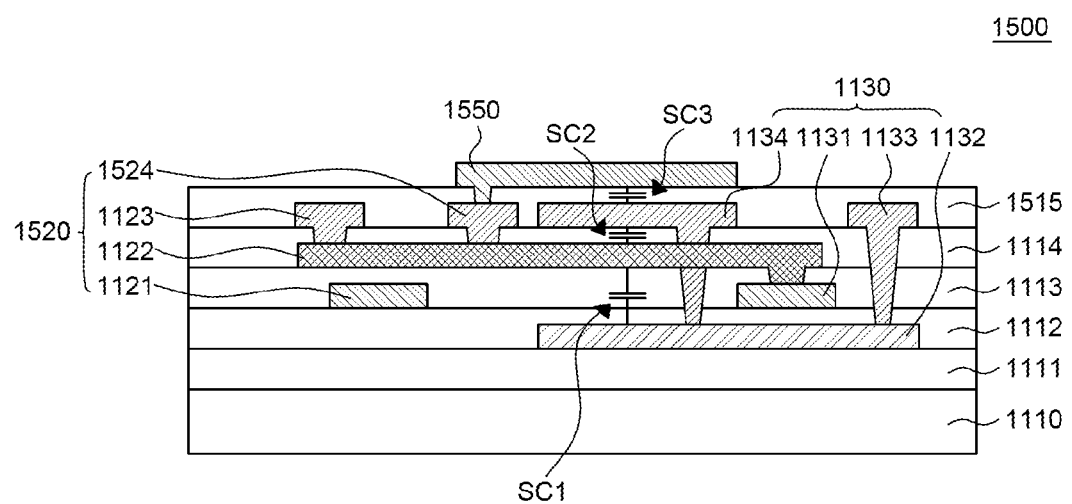

FIG. 9 is a schematic cross-sectional plan view for illustrating an OLED device according to yet another exemplary embodiment of the present invention. The OLED device 1500 shown in FIG. 9 is substantially identical to the OLED device 1100 shown in FIG. 6 except for that the former further includes a source electrode 1524 of a switching thin-film transistor 1520, a passivation layer 1515 and a metal layer 1550, in turn, a third storage capacitor SC3; and, therefore, descriptions on the like elements will not be made again.

Referring to FIG. 9, the passivation layer 1515 is formed to cover the source electrode 1524 and the drain electrode 1123 of the switching thin-film transistor 1520 and the source electrode 1134 and the drain electrode 1133 of the driving thin-film transistor 1130. The passivation layer 1515 is made of an insulative material to protect the driving thin-film transistor 1130 and the switching thin-film transistor 1520.

On the passivation layer 1515 is formed the metal layer 1550. The metal layer 1550 is electrically connected to the source electrode 1524 of the switching thin-film transistor 1520 and may overlap the source electrode 1524 of the driving thin-film transistor 1130. Accordingly, the OLED device 1500 according to this exemplary embodiment of the present invention further includes the third storage capacitor SC3, one of its electrodes being the source electrode 1134 of the driving thin-film transistor 1130 and the other of its electrodes being the metal layer 1550.

In the OLED device 1500 according to this exemplary embodiment of the present invention, by employing a composite thin-film transistor in which the switching thin-film transistor 1520 is an oxide semiconductor thin-film transistor and the driving thin-film transistor 1130 is an LTPS thin-film transistor, together with the metal layer 1550, it is possible to implement a storage capacitor having a triple-layer capacitor structure. In other words, the active layer 1132 of the driving thin-film transistor 1130 and the active layer 1122 of the switching thin-film transistor 1520 form a first storage capacitor SC1, the source electrode 1134 of the driving thin-film transistor 1130. Also, the active layer 1122 of the switching thin-film transistor 1520 form a second storage capacitor SC2, and the source electrode 1134 of the driving thin-film transistor 1130 and the metal layer 1550 form a third storage capacitor SC3, so that capacitance of the storage capacitor can be increased in a given area. By virtue of the triple-layer capacitor structure, the area occupied by the storage capacitors can be further reduced and thus the OLED device 1500 with high resolution and high transparency can be implemented.

In FIG. 9, the metal layer 1550 is added to the OLED device 1100 shown in FIG. 6. However, the metal layer 1550 shown in FIG. 9 may be applied to the OLED device 1300 shown in FIG. 7 and to the OLED device 1400 shown in FIG. 8 as well.

The source electrode 1524 and the drain electrode 1123 of the switching thin-film transistor 1520 shown in FIG. 9 are interchangeable. The source electrode 1134 and the drain electrode 1133 of the driving thin-film transistor 1130 shown in FIG. 9 are interchangeable.

Figure 10:
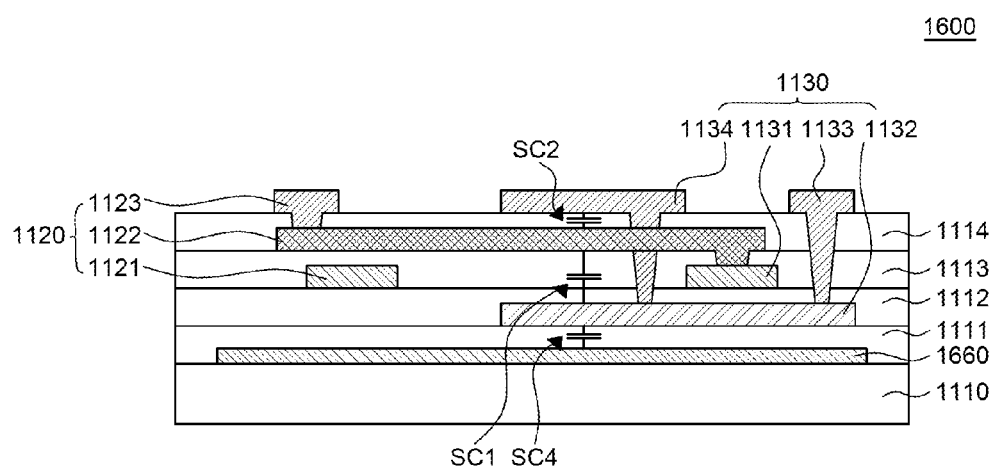

FIG. 10 is a schematic cross-sectional plan view for illustrating an OLED device according to yet another exemplary embodiment of the present invention. The OLED device 1600 shown in FIG. 10 is substantially identical to the OLED device 1100 shown in FIG. 6 except that the former further includes a light-blocking layer 1660 and a fourth storage capacitor SC4; and, therefore, descriptions on the like elements will not be made again.

Referring to FIG. 10, the light-blocking layer 1660 is formed on the substrate 1110. The light-blocking layer 1660 blocks light directed toward the active layer 1122 of the switching thin-film transistor 1120 and the active layer 1132 of the driving thin-film transistor 1130. The active layer 1122 of the switching thin-film transistor 1120 and the active layer 1132 of the driving thin-film transistor 1130 are very sensitive to light. In particular, the active layer 1122 of the switching thin-film transistor 1120, which is made of an oxide semiconductor, is much more sensitive to light. If light is apparent on an active layer of an oxide semiconductor thin-film transistor, leakage current may be increased and the threshold voltage may be shifted. This leads to failure in driving the overall panel, increase in power consumption and panel reliability problems such as panel non-uniformity. Although an LTPS thin-film transistor is less sensitive to light than an oxide semiconductor thin-film transistor, the above-mentioned problems may also occur in the LTPS thin-film transistor. If the OLED device 1600 according to this exemplary embodiment of the present invention is of a bottom emission type, the reliability problems caused by light incident from the outside are less likely to occur because of the use of a polarizer. If the OLED device 1600 is of a top emission type, however, it is very vulnerable to light from the outside on the lower side of the OLED device 1600 since the polarizer is disposed only on upper side of the OLED device 1600. Further, the polarizer is eliminated if the OLED device 1600 is a transparent OLED device, and thus light becomes apparent continuously through transmissive portions as well and accordingly the properties of thin-film transistors are changed even faster.

For these reasons, the OLED device 1600 according to still another exemplary embodiment of the present invention employs the light-blocking layer 1660 that blocks light directed toward the active layer 1122 of the switching thin-film transistor 1120 and the active layer 1132 of the driving thin-film transistor 1130 to thereby solve the above-mentioned problems.

Although not shown in FIG. 10, the light-blocking layer 1660 may be electrically connected to the gate electrode 1121 of the switching thin-film transistor 1120 or the gate electrode 1131 of the driving thin-film transistor 1130. If the light-blocking layer 1660 is simply patterned, i.e., it is referenced to a floating potential, the light-blocking layer 1660 has a certain level of voltage, so that a channel is formed in the driving thin-film transistor 1130 or in the switching thin-film transistor 1120 to thereby allow current to flow therein. This may cause malfunction of the thin-film transistors. In other words, it is difficult to control turning on/off the thin-film transistors unless the voltage level of the light-blocking layer 1660 is fixed to a constant value in the composite thin-film transistor structure. For this reason, in the OLED device 1600 according to this exemplary embodiment of the present invention, the light-blocking layer 1660 is electrically connected to the gate electrode 1121 of the switching thin-film transistor 1120 or the gate electrode 1131 of the driving thin-film transistor 1130, thereby preventing the malfunction of the driving thin-film transistor 1130 and the switching thin-film transistor 1120.

Additionally, the light-blocking layer 1660 may work as one electrode of the fourth storage capacitor SC4. Namely, as shown in FIG. 10, the light-blocking layer 1660 and the active layer 1132 of the driving thin-film transistor 1130 may work as the electrodes of the fourth storage capacitor SC4.

In the OLED device 1600 according to this exemplary embodiment of the present invention, by employing a composite thin-film transistor in which the switching thin-film transistor 1120 is an oxide semiconductor thin-film transistor and the driving thin-film transistor 1130 is an LTPS thin-film transistor, together with the light-blocking layer 1660, it is possible to implement a storage capacitor having a triple-layer capacitor structure. In other words, the active layer 1132 of the driving thin-film transistor 1130 and the active layer 1122 of the switching thin-film transistor 1120 form a first storage capacitor SC1, the source electrode 1134 of the driving thin-film transistor 1130 and the active layer 1122 of the switching thin-film transistor 1120 form a second storage capacitor SC2, and the active layer 1132 of the driving thin-film transistor 1130 and the light-blocking layer 1660 form a fourth storage capacitor SC4, so that capacitance of the storage capacitor can be increased in a given area. By virtue of the triple-layer capacitor structure, the area occupied by the storage capacitors can be further reduced and thus the OLED device 1600 with high resolution and high transparency can be implemented.

The light-blocking layer 1660 illustrated in FIG. 10 may be applied to the OLED devices 1300, 1400 and 1500 illustrated in FIGS. 7 to 9, respectively. As the light-blocking layer 1660 is applied, the fourth storage capacitor SC4 may also be included in the OLED devices 1300, 1400 and 1500 illustrated in FIGS. 7 to 9, respectively.

The drain electrode 1123 of the switching thin-film transistor 1120 shown in FIG. 10 may be replaced with the source electrode. The source electrode 1134 and the drain electrode 1133 of the driving thin-film transistor 1130 shown in FIG. 10 are interchangeable.

Figure 11:
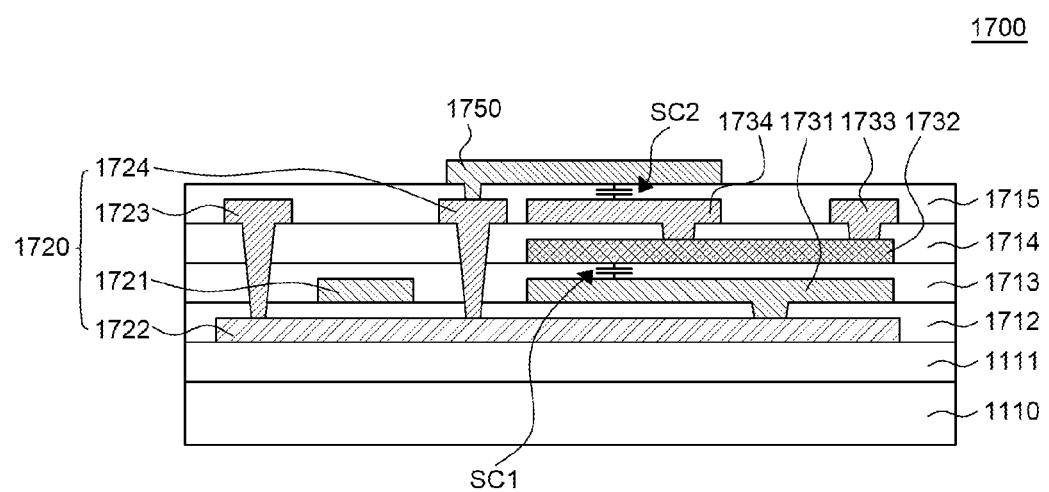

FIG. 11 is a schematic cross-sectional plan view for illustrating an OLED device according to yet another exemplary embodiment of the present invention. Referring to FIG. 11, an OLED device 1700 includes a substrate 1100, a switching thin-film transistor 1720, a driving thin-film transistor 1730, a metal layer 1750, a first storage capacitor SC1 and a second storage capacitor SC2. The OLED device 1700 shown in FIG. 11 is substantially identical to the OLED device 1500 shown in FIG. 9 except for the positions at which a gate electrode 1721, an active layer 1722, a source electrode 1724 and a drain electrode 1723 of a switching thin-film transistor 1720, and a gate electrode 1731, an active layer 1732, a source electrode 1734 and a drain electrode 1733 of a driving thin-film transistor 1730 are formed; and, therefore, descriptions on the like elements will not be made again.

On the buffer layer 1111, the switching thin-film transistor 1720 and the driving thin-film transistor 1730 are formed. the switching thin-film transistor 1720 is a coplanar thin-film transistor. Specifically, the switching thin-film transistor 1720 has a structure in which the active layer 1722, the gate electrode 1721, the source electrode 1724 and the drain electrode 1723 on the substrate 1110 are stacked on one another in this order. The driving thin-film transistor 1730 is a bottom gate thin-film transistor. Specifically, the driving thin-film transistor 1730 has a structure in which the gate electrode 1731, the active layer 1732, the source electrode and the drain electrode 1733 on the substrate 1110 are stacked on one another in this order.

Referring to FIG. 11, the active layer 1722 of the switching thin-film transistor 1720 is formed on the buffer layer 1111. The active layer 1722 of the switching thin-film transistor 1720 is made of a low temperature poly silicon. Namely, the switching thin-film transistor 1720 is an LTPS thin-film transistor.

On the active layer 1722 of the switching thin-film transistor 1720 is formed a gate insulation layer 1712. The gate insulation layer 1712 covers the active layer 1722 of the switching thin-film transistor 1720. The gate insulation layer 1712 is made of an insulative material so as to insulate the active layer 1722 from the gate electrode 1721 of the switching thin-film transistor 1720.

On the gate insulation layer 1712 are formed the gate electrode 1721 of the switching thin-film transistor 1720 and the gate electrode 1731 of the driving thin-film transistor 1730. The gate electrode 1721 of the switching thin-film transistor 1720 may be made of the same material as the gate electrode 1731 of the driving thin-film transistor 1730.

An interlayer insulation layer 1713 is formed over the gate insulation layer 1721 of the switching thin-film transistor 1720 and the gate electrode 1731 of the driving thin-film transistor 1730. The interlayer insulation layer 1713 covers the gate electrode 1721 of the switching thin-film transistor 1720 and the gate electrode 1731 of the driving thin-film transistor 1730. The interlayer insulation layer 1713 is made of an insulative material so as to insulate the active layer 1732 from the gate electrode 1731 of the driving thin-film transistor 1730.

On the interlayer insulation layer 1713 is formed the active layer 1732 of the driving thin-film transistor 1730. The active layer 1732 of the driving thin-film transistor 1730 is made of an oxide semiconductor. Namely, the driving thin-film transistor 1730 is an oxide semiconductor thin-film transistor.

The active layer 1732 of the driving thin-film transistor 1730 overlaps the gate electrode 1731 of the driving thin-film transistor 1730. The active layer 1732 of the driving thin-film transistor 1730 overlaps the gate electrode 1731 of the driving thin-film transistor 1730 not only at a position between the source electrode 1734 and the drain electrode 1733 of the driving thin-film transistor 1730, where a channel is created when the driving thin-film transistor 1730 is turned on, but also at a position where no channel is formed.

An etch stopper 1714 is formed over the active layer 1732 of the driving thin-film transistor 1730. The etch stopper 1714 covers the active layer 1732 of the driving thin-film transistor 1730. The etch stopper 1714 is made of an insulative material so as to insulate the active layer 1732 of the driving thin-film transistor 1730 from the source electrode 1734 and the drain electrode 1733 of the driving thin-film transistor 1730, and from the source electrode 1724 and the drain electrode 1723 of the switching thin-film transistor 1720.

On the etch stopper 1714, the source electrode 1724 and the drain electrode 1723 of the switching thin-film transistor 1720, and the source electrode 1734 and the drain electrode 1733 of the driving thin-film transistor 1730 are formed. A passivation layer 1715 is formed over the source electrode 1724 and the drain electrode 1723 of the switching thin-film transistor 1720, and over the source electrode 1734 and the drain electrode 1733 of the driving thin-film transistor 1730. On the passivation layer 1715 is formed the metal layer 1750. The metal layer 1750 is electrically connected to the source electrode 1724 of the switching thin-film transistor 1720. In addition, the metal layer 1750 overlaps the source electrode 1734 of the driving thin-film transistor 1730.

A first storage capacitor SC1 and a second storage capacitor SC2 are formed on the substrate 1110. The first storage capacitor SC1 and the second storage capacitor SC2 work as one storage capacitor. One electrode of the first storage capacitor SC1 is the gate electrode 1731 of the driving thin-film transistor 1730 and the other electrode of the first storage capacitor SC1 is the active layer 1732 of the driving thin-film transistor 1730 which overlaps the gate electrode 1731 of the driving thin-film transistor 1730. One electrode of the second storage capacitor SC2 is the source electrode 1734 of the driving thin-film transistor 1730 and the other is the metal layer 1750.

In the OLED device 1700 according to this exemplary embodiment of the present invention, by employing a composite thin-film transistor in which the switching thin-film transistor 1720 is an oxide semiconductor thin-film transistor and the driving thin-film transistor 1730 is an LTPS thin-film transistor, it is possible to implement a storage capacitor having a double-layer capacitor structure. Consequently, capacitance of the storage capacitors can be increased in a given area. Further, by virtue of the double-layered capacitor structure, the OLED device 1700 with high resolution and high transparency can be implemented.

Additionally, in the OLED device 1700 according to yet another exemplary embodiment of the present invention, an oxide semiconductor thin-film transistor with good saturation property is used as the driving thin-film transistor 1730, so that the OLED device can be driven stably and power consumption can be saved.

The source electrode 1724 and the drain electrode 1723 of the switching thin-film transistor 1720 shown in FIG. 11 are interchangeable. The source electrode 1724 and the drain electrode 1733 of the driving thin-film transistor 1730 shown in FIG. 11 are interchangeable.

Thus far, exemplary embodiments of the present invention have been described in detail with reference to the accompanying drawings. However, the present invention is not limited to the exemplary embodiments, and modifications and variations can be made thereto without departing from the technical idea of the present invention. Accordingly, the exemplary embodiments described herein are merely illustrative and are not intended to limit the scope of the present invention. The technical idea of the present invention is not limited by the exemplary embodiments. The protective range of the present invention should be construed on the basis of claims and all the technical spirits in the equivalent range should be construed as being included in the scope of the right of the present invention.

What is claimed is:

1. An organic light-emitting display (OLED) device, comprising:
   a first pixel, a switching thin-film transistor configured to be an oxide semiconductor thin-film transistor being disposed in the first pixel; and
   a second pixel adjacent to the first pixel in the direction in which data lines are extended, a switching thin-film transistor configured to be an LTPS (Low Temperature Poly-Silicon) thin-film transistor being disposed in the second pixel;
   wherein the switching thin-film transistor of the first pixel and the switching thin-film transistor of the second pixel are connected to the same gate line.

2. The device of claim 1, wherein the gate electrode of the first switching thin-film transistor and the gate electrode of the second switching thin-film transistor branch out from the same gate line.

3. The device of claim 1, wherein the switching thin-film transistor of the first pixel and the switching thin-film transistor of the second pixel are connected to the same data line.

4. The device of claim 1, wherein the first pixel and the second pixel each have emission regions in which organic light-emitting elements are disposed and element regions in which elements for driving the organic light-emitting elements are disposed, respectively,
   the switching thin-film transistor of the first pixel is disposed in the element region of the first pixel,
   the switching thin-film transistor of the second pixel is disposed in the element region of the second pixel, and
   the element region of the first pixel and the element region of the second pixel are adjacent to each other.

5. The device of claim 4, wherein each of the first and second pixels further comprises a transparent region, and
   the element region of the first pixel and the element region of the second pixel are disposed between the transparent region of the first pixel and the transparent region of the second pixel.

6. The device of claim 1, further comprising:
   a GIP (Gate In Panel) circuit portion configured to generate an electrical signal to drive the first and second pixels,
   wherein the GIP circuit portion is configured to generate AC gate voltage to sequentially drive the switching thin-film transistor of the first pixel and the switching thin-film transistor of the second pixel.

7. The device of claim 1, further comprising:
a light-blocking layer configured to block light directed toward active layer of the switching thin-film transistors.

8. The device of claim 1, wherein the first pixel further comprises:
 a driving thin-film transistor connected to the switching thin thin-film transistor configured to be an oxide semiconductor thin-film transistor;
 a first storage capacitor having one electrode being the active layer of the driving thin-film transistor; and
 a second storage capacitor having one electrode being the source electrode or the drain electrode of the driving thin-film transistor,
 wherein the first storage capacitor and the second storage capacitor are disposed to overlap each other, and
 the driving thin-film transistor is an LTPS thin-film transistor.

9. The device of claim 8, wherein both the other electrode of the first storage capacitor and the other electrode of the second storage capacitor are the active layer of the switching thin-film transistor.

10. The device of claim 9, further comprising:
 a third storage capacitor overlapped with the first storage capacitor and the second storage capacitor,
 wherein one electrode of the third storage capacitor is the source electrode or the drain electrode of the driving thin-film transistor, and
 the other electrode of the third storage capacitor is a metal layer electrically connected to the source electrode or the drain electrode of the switching thin-film transistor.

11. The device of claim 8, wherein both the other electrode of the first storage capacitor and the other electrode of the second storage capacitor are the gate electrode of the driving thin-film transistor.

12. The device of claim 8, wherein the other electrode of the first storage capacitor is the gate electrode of the driving thin-film transistor, and
 the other electrode of the second storage capacitor is the active layer of the switching thin-film transistor.

13. The device of claim 8, further comprising:
 a light-blocking layer configured to block light directed toward the active layers of the switching thin-film transistor and of the driving thin-film transistor; and
 a fourth storage capacitor disposed to overlap with the first storage capacitor and the second storage capacitor,
 wherein one electrode of the fourth storage capacitor is the active layer of the driving thin-film transistor, and
 the other electrode thereof is the light-blocking layer.

14. The device of claim 1, wherein the second pixel further comprises:
 a driving thin-film transistor connected to the switching thin thin-film transistor configured to be an LTPS semiconductor thin-film transistor;
 a metal layer electrically connected to the source electrode or the drain electrode of the switching thin-film transistor;
 a first storage capacitor having one electrode being the gate electrode of the driving thin-film transistor and the other electrode being the active layer of the driving transistor; and
 a second storage capacitor having one electrode being the source electrode or the drain electrode of the driving thin-film transistor and the other electrode being the metal layer,
 wherein the first storage capacitor and the second storage capacitor are disposed to overlap each other, and
 wherein the driving thin thin-film transistor is an oxide semiconductor thin-film transistor.

15. The device of claim 14, wherein
a gate insulation layer is disposed to cover the active layer of the switching thin-film transistor,
the gate electrode of the switching thin-film transistor and the gate electrode of the driving thin-film transistor are disposed on the insulation layer,
an interlayer insulation layer is disposed to cover the gate electrode of the switching thin-film transistor and the gate electrode of the driving thin-film transistor,
the active layer of the driving thin-film transistor overlaps the gate electrode thereof on the interlayer insulation layer,
an etch stopper is disposed to cover the active layer of the driving thin-film transistor, and
the metal layer is electrically connected to the source electrode or the drain electrode of the switching thin-film transistor disposed on the etch stopper and overlaps the source electrode or the drain electrode of the driving thin-film transistor.

\* \* \* \* \*